(12) United States Patent
Yoshikawa et al.

(10) Patent No.: US 7,210,862 B2
(45) Date of Patent: May 1, 2007

(54) OPTICAL SUBASSEMBLY WITH A HEAT-RADIATING FIN AND AN OPTICAL TRANSCEIVER INSTALLING THE SAME

(75) Inventors: Satoshi Yoshikawa, Kanagawa (JP); Toshio Mizue, Kanagawa (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 11/150,282

(22) Filed: Jun. 13, 2005

(65) Prior Publication Data

US 2005/0286579 A1  Dec. 29, 2005

Related U.S. Application Data

(60) Provisional application No. 60/579,969, filed on Jun. 16, 2004.

(51) Int. Cl.
*G02B 6/255* (2006.01)
*G02B 6/42* (2006.01)
(52) U.S. Cl. .............................. 385/92; 385/88; 385/14
(58) Field of Classification Search ................ 385/88, 385/92, 14
See application file for complete search history.

(56) References Cited

U.S. PATENT DOCUMENTS

| | | | | |
|---|---|---|---|---|
| 5,117,476 A | * | 5/1992 | Yingst et al. | ................ 385/88 |
| 2003/0021310 A1 | | 1/2003 | Kingsley | |
| 2003/0091349 A1 | * | 5/2003 | Sato et al. | ................ 398/135 |
| 2003/0152340 A1 | * | 8/2003 | Kurashima | ................ 385/92 |
| 2005/0100293 A1 | * | 5/2005 | Warashina et al. | ............ 385/92 |
| 2005/0158052 A1 | * | 7/2005 | Larson | ................ 398/135 |
| 2005/0162761 A1 | * | 7/2005 | Hargis et al. | ................ 359/820 |
| 2006/0002666 A1 | * | 1/2006 | Ice | ................ 385/92 |
| 2006/0024005 A1 | * | 2/2006 | Ice et al. | ................ 385/92 |
| 2006/0093287 A1 | * | 5/2006 | Yoshikawa et al. | ........... 385/92 |

OTHER PUBLICATIONS

Ichino et al. "Small Form Factor Pluggable Optical Transceiver Module with Extremely Low Power Consumption for Dense Wavelength Division Multiplexing Applications." Electronic Components and Technology, 2005 ECTC '05 Proceedings. May 31-Jun. 3, 2005. pp. 1044-1049. vol. 1.*

* cited by examiner

*Primary Examiner*—John D. Lee
*Assistant Examiner*—Rhonda S. Peace
(74) *Attorney, Agent, or Firm*—Venable LLP; Michael A. Sartori; Steven J. Schwarz

(57) ABSTRACT

The present invention provides a configuration to improve a heat-radiating effect of an optical subassembly having a co-axial package and a plurality of lead pins arranged in an arrayed shape. The heat generated inside the subassembly may be dissipated through the heat-radiating fin attached to a flat surface, not a curved side surface of the subassembly such that the lead pins provided in the subassembly pass through the slot provided in the heat-radiating fin. The heat-radiating fin has a slab portion attached to the cover of the transceiver, when the subassembly is installed within the transceiver. Thus, the heat generated in the subassembly can be easily and effectively dissipated to the cover.

16 Claims, 5 Drawing Sheets

OPTICAL SUBASSEMBLY WITH A HEAT-RADIATING FIN AND AN OPTICAL TRANSCEIVER INSTALLING THE SAME

CROSS REFERENCE TO RELATED APPLICATIONS

This application claims the benefit of prior filed U.S. Provisional Application 60/579,969 filed on Jun. 16, 2004 entitled "An optical sub-assembly with a radiating fin and an optical transceiver installing the same" by inventors Yoshikawa; S., and Mizue; T., which is incorporated herein by reference in its entirety.

BACKGROUND OF THE INVENTION

1. Field of the Invention

The present invention relates to an optical assembly (hereinafter denoted as OSA), in particular, to configuration for heat dissipation thereof that installs a device generating a large heat.

2. Related Prior Art

The OSA installs an optical semiconductor device therein. A semiconductor laser diode and a semiconductor photodiode are well known as the optical semiconductor device. The OSA installing the laser diode is called as a transmitting optical sub-assembly (TOSA), while the OSA installing the photodiode is called as a receiving optical sub-assembly (ROSA). Recently, as the tramsmission speed of the optical communication increases, the optical semiconductor device must be operated in high speed, which inevitably enhances the heat dissipation of the semiconductor device. Therefore, the TOSA or the ROSA should require the configuration by which the heat generated thereof effectively dissipates to the outside of the TOSA or the ROSA.

United States patent application published as US 20030021310A1 has disclosed various configurations for the heat dissipation of the OSA with a co-axial shape. FIG. 1 of this application has illustrated a radiating fin 140 having an opening mating with the stem of the OSA. The radiating fin 140 is extended from the header 104 and attached to the heat sink 146. FIG. 3 of this application has illustrated another arrangement in which a member 306, fitting to the outer shape of the stem 312, touches thereto in one end thereof, and the other end is extended from the stem 312 and attached to the heat sink 304. Further, a metal member 404 surrounding the stem 410 directly touches the heat sink 406 in FIG. 4 of this application.

Generally, the OSA is used as one of components for an optical data link or an optical transceiver. The arrangement of the heat dissipation of the OSA should take the structure of the data link or the optical transceiver into account. Moreover, from the material point of view, a cost saving material such as alloy of copper and tungsten (CuW) should be avoided even if such material has good thermal conductivity.

Based on the background described above, one object of the present invention is to provide an OSA and an optical transceiver using the OSA with an effective heat dissipating arrangement and without using a cost ineffective material.

SUMMARY OF THE INVENTION

One aspect of the present invention relates to an optical subassmbly that is coupled with an optical fiber. The optical sub assembly comprises a semiconductor optical device, a co-axial package, a plurality of cylindrical members, and a heat-radiating fin. The semiconductor optical device may be a semiconductor light-transmitting device such as laser diode, or a semiconductor light-receiving device such as photodiode. The co-axial package comprises a disk-shaped stem, a plurality of lead pins, and a cap. The stem and the cap, combined with each other, form a cavity to install the semiconductor optical device therein. The stem has first and second flat surfaces and a curved side surface connecting these first and second surface. The cylindrical member, attached to the co-axial package, optically couples the semiconductor optical device with the optical fiber to be received by the cylindrical members. The heat-radiating fin is attached to the second surface of the stem such that the lead pins pass through the heat-radiating fin.

In the present invention, since the heat-radiating fin is attached to the one of the flat surface of the stem and the other flat surface mounts the semiconductor optical device that generates heat, the heat can be effectively dissipated through the stem and the heat-radiating fin to the outside of the subassembly.

The lead pins provided in the stem of the optical subassembly may be grouped in two groups. Each group forms an array of lead pins, and the array extends in parallel to each other. The heat-radiating fin attached to the stem may provide slots to pass these arrayed-lead pins. Therefore, the positioning between the subassembly and the heat-radiating fin may be facilitated.

Moreover, the heat-radiating fin may provide a finger and the stem may provide a groove in the side surface thereof. Since these finger and the groove may mate with each other. This arrangement may be further facilitated in the positioning between the stem and the heat-radiating fin.

The heat-radiating fin of the present invention may provide a body portion and a slab portion extending and bending from the body portion. The slab portion has a relatively wide area, and the body portion is attached to the stem. Therefore, the heat generated in the subassembly and transmitted to the heat-radiating fin through the stem can be effectively dissipated to the outside of the subassembly through the slab portion. When the slab portion is attached to a medium or a heat sink, the heat dissipating effect can be further enhanced.

Another aspect of the invention relates to an optical transceiver that includes at last an optical subassembly with an enhanced heat-radiating mechanism mentioned above. The optical transceiver comprises, lower and upper covers, a frame sandwiched by the lower and upper covers, the optical subassembly, and a substrate. The optical subassembly provides a heat-radiating fin and two arrayed-lead pins. The arrayed-lead pins are connected to the substrate by sandwiching the substrate therebetween. Further, the heat-radiating fin may provide legs extending from the body portion. These legs, with a gap therebetween coincident with a gap between two arrayed-lead pins, also sandwich the substrate. Thus, the arrayed-lead pin and the leg of the heat-radiating fin may be soldered with surface mounting.

BRIEF DESCRIPTION OF DRAWINGS

FIG. 2A illustrates the optical subassembly; while

DETAILED DESCRIPTION OF PREFERRED EMBODIMENTS

First Embodiment

Figure 1A:
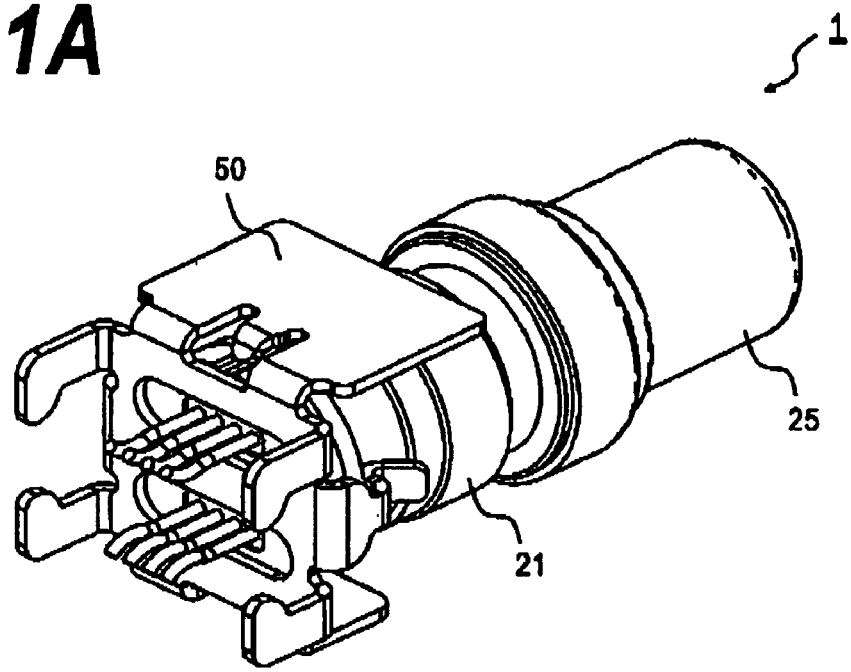
FIG. 1A is a perspective view illustrating an optical subassembly with a heat-radiating fin according to the present invention.
Figure 1B:
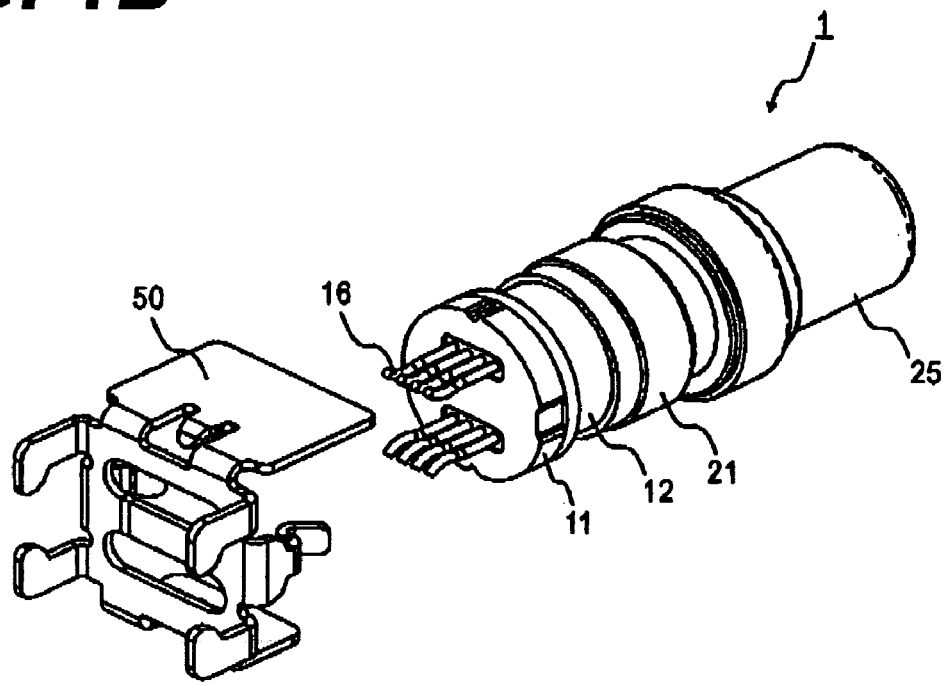
FIG. 1B is an exploded view of the optical subassembly and the heat-radiating fin.

Next, preferred embodiments of the present invention will be described as referring to accompanying drawings. FIG. 1A is a perspective view of an OSA with a heat-radiating fin, and FIG. 1B is an exploded view of the OSA according to the present invention. Next, the OSA, and the radiating fin will be described in detail.

Figure 2A:
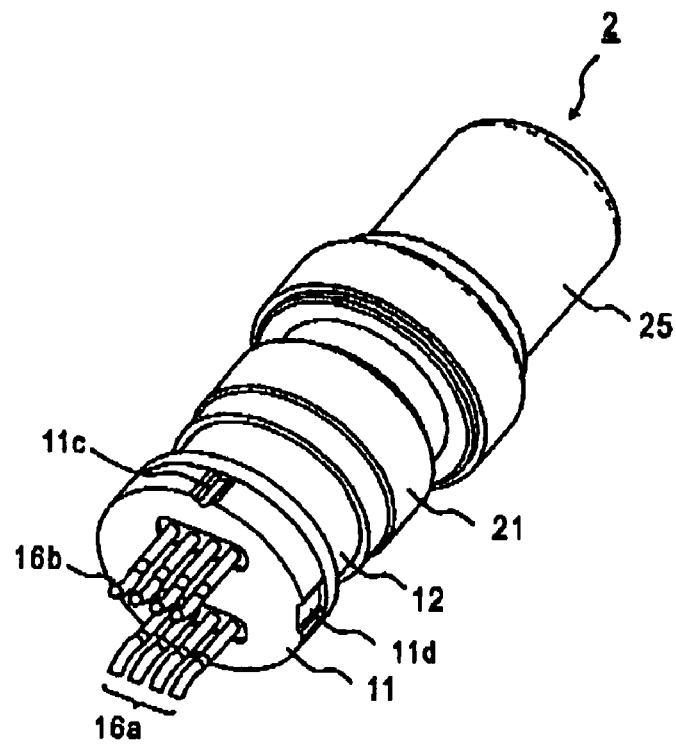
Figure 2B:
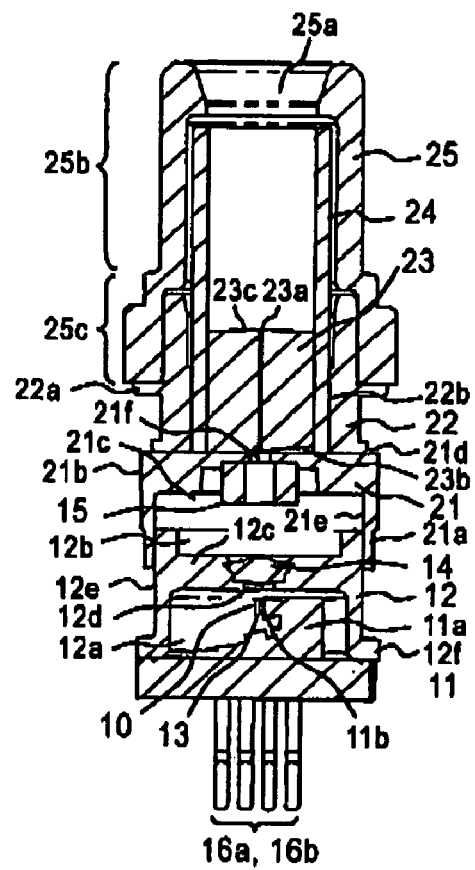
FIG. 2B shows a cross section of the optical subassembly along the optical axis.

FIG. 2A is a perspective view of the OSA, and FIG. 2B is a cross sectional view of the OSA. The OSA assembles several tubular members, namely, the OSA having a co-axial package, includes a stem 11 with a disk shape, a cap 12, an alignment member 21, a bush 22, a stub 23, a sleeve 24, and a sleeve cover 25.

The stem 11 is made of, for example iron coated with nickel or coated with nickel and gold. A plurality of grooves, 11b and 11c, extending along the center axis of the cylindrical members is provided in a side of the stem 11. The groove 11c, as described later, is provided for positioning the heat-radiating fin 50, while the other groove 11b, which is wider and shallower than the former groove 11b, is for the identification of the lead pin 16. On the stem 11 is arranged with a light-transmitting device 10, such as semiconductor laser diode, via a sub-mount 11a. The sub-mount 11a, protrudes from the primary surface of the stem 11, and includes the mounting surface 11b where the heat sink 13 is disposed thereon. The light-transmitting device 10 is mounted on the heat sink 13 to align the optical axis thereof coinciding with the center axis of cylindrical members 21 to 24.

The cap 12 is also a cylindrical member that includes a first bore 12a, a second bore 12b, and a wall 12c partitioning the first and second bores, 12a and 12b. The cap 12 is placed on the stem 11 with a flange 12d provided in an end portion thereof facing the stem 11. That is, the end surface of the flange 12d is resistance welded to the primary surface of the stem 11 under inert atmosphere such as dry nitrogen. Accordingly, the semiconductor light-transmitting device 10 is airtightly sealed within the first bore 12a, which forms a cavity. An outer diameter of the cap 12 is slightly smaller than that of the stem 11.

An aperture is provided on the center of the partition 12c, and a lens 14 is secured to the cap 12 to seal the aperture 12c. Generally, the optical axis of the lens 14 coincides with that of the light transmitting device 10. However, in order to prevent light reflected from the surface of the lens 14 from returning the light transmitting device 10, the optical axis of the lens 14 and that of the light transmitting device 10 may be intentionally inclined with respect to each other.

The alignment member 21 includes side portion 21a and a bottom portion 21b. The side portion 21a forms a bore 21c, the inner diameter of which is slightly larger than the outer diameter of the cap 12. Accordingly, by sliding the inner surface 21e of the alignment member 21 on the outer surface 21e of the cap 12, an optical alignment along the optical axis, which along the center axis of cylindrical members, can be performed. Thickness of the side portion 21a is thin to enable the YAG-laser welding between the side portion 21a and the outer surface 12e of the cap 12 from the outside of the side potion 21a. After optical alignment, the alignment member 21 and the cap are YAG-laser welded.

On the center of the bottom portion 21b is provided with an aperture 21f for passing light emitted from the light transmitting device 10 and concentrated by the lens 14. A portion of the aperture 21f may expand its diameter into which an optical isolator 15 may be arranged to enable the alignment member 21, the bottom portion 21b thereof, close to the cap 12. Therefore, even the lens 14 with a shorter focal length may be applicable in the present arrangement. The outer surface 21d, the top surface thereof, is processed in flat to enable the optical alignment of the bush 22, the stub 23, and the sleeve 24 with the light transmitting device 10 by adding these members on the top surface 21d.

The bush 22 secures the sleeve 24 therein. The sleeve 24 is press fitted by the bush 22. In another word, the bush 22 is press-fitter between the sleeve 24 and sleeve cover 25. An end of the bush 22, integrally with the sleeve 24 and the stub 23, may slide on the flat surface 21d of the alignment member 21. Thus, the optical alignment in directions perpendicular to the center axis of cylindrical members can be carried out. One end 22a of the bush 22 provides a flange, and the YAG-laser welding between the bush 22 and the flat surface 21d of the alignment member 21 is performed at this flange after the optical alignment therebetween is completed.

On the outer surface of the bush 22 is provided with a flange 22a to receive, as explained later, the root portion 25c of sleeve cover 25. Although the sleeve cover 25 is a member independent of the optical alignment, when the subassembly 2 is installed in, for example, the optical transceiver, the position of the subassembly must be defined within the transceiver. The flange 22a cooperated with another flange 25c, which will be explained later, may decide the position of the subassembly 2 within the transceiver.

Generally, the split sleeve is used for the sleeve 24. The split sleeve has a slit along the axis thereof, and may expand to directions perpendicular to the optical axis when a ferrule with a diameter slightly larger than that of the ferrule. However, a rigid sleeve may be used as the sleeve 24 in the present invention. The rigid sleeve includes no slit and has a diameter slightly larger than that of the ferrule. The sleeve 24, independent of the split sleeve, may be made of ceramic such as zirconia, metal such as stainless steel, or new material such as amorphous metal. The outer diameter of the sleeve 24 is slightly larger than the diameter of the inner surface 22b of the bush 22, accordingly, the bush 22 is press-fitted between the sleeve 22 and the sleeve cover 25, which mechanically secures the stub 23 with the end portion of the sleeve 24. The end of the sleeve 24 and that of the bush 22 coincide to each other.

The sleeve cover 25 positions in forward of the bush 22 that covers the bush 22 by a portion 25c thereof and portions of the sleeve 24 not covered by the bush 22 by a portion 25b of the sleeve cover 25. The inner diameter of the sleeve cover 25 is larger than the outer diameter of the sleeve 24.

Accordingly, a gap is formed therebetween. The opening 25a, formed at the end portion of the sleeve cover 25, has a chamfer that facilitates the insertion of the extraction of the ferrule that is not illustrated in FIG. 2B and is to be mated with the sleeve 24.

The root 25c of the sleeve cover 25 has a greater diameter than that of the tip portion 25b to form a flange. To insert this flange into the holder, which is illustrated in FIG. 5, and to fix the holder to the transceiver body defines the position of the subassembly within the transceiver. The position of the subassembly must conform to the standard of the optical connector mated to the optical receptacle formed by the transceiver's body. By providing the flange 25c in the sleeve cover 25, the standard can be fulfilled.

The end of the sleeve 24, i.e. the end close to the alignment member 21, inserts the stub 23, configuration of which is similar to the ferrule. That is, a coupling fiber 23a is secured in the center thereof, and an end surface 23b thereof is processed with the coupling fiber 23a to incline to the optical axis. The light emitted from the light-transmitting device 10, passing the lens 14 and the optical isolator 15, enters the tip of the coupling fiber 23a. Portion of the incident light is reflected by the tip of the coupling fiber 23a. Because of the inclined surface of the tip of the coupling fiber 23a, the reflected light does not return the light-transmitting device 10, which does not make an optical noise source in the light-transmitting device 10.

The other end surface 23c of the stub 23, the side apart from the light-transmitting device 10 is also processed in spherical with the coupling fiber 23a. Both end surfaces of the stub 23 and the coupling fiber 23a coincides with each other. The end surface of the ferrule to be mated with the sleeve 24 has the same structure as the stub 23 with the coupling fiber 23a. That is, the ferrule has an optical fiber in the center thereof, and the end surface of the ferrule and that of the fiber not only coincides with each other but also forms in spherical. Therefore, the coupling fiber 23a and the optical fiber in the ferrule can be physically in contact to each other, which reduces the optical reflection at the interface therebetween.

As illustrated in FIG. 2A and FIG. 2B, a plurality of the lead pins 16 protrudes from the outer surface of the stem 11. In the present embodiment, two groups 16a and 16b of the lead pin, both groups including four lead pins, are arranged in parallel to each other. Electrical isolation between the lead pins 16 and the stem 11 is performed such that four lead pins in each groups, 16a 16b, are collectively glass-sealed. The gap to the nearest pins is about 5 mil (about 0.3 mm) and the space between two groups is about 100 mil (about 2.0 mm). These types of lead pins, 16a and 16b, are called as an arrayed-lead pin, and has an advantage to increase the number of lead pins without enlarging the diameter of the stem 11.

Figure 3A:
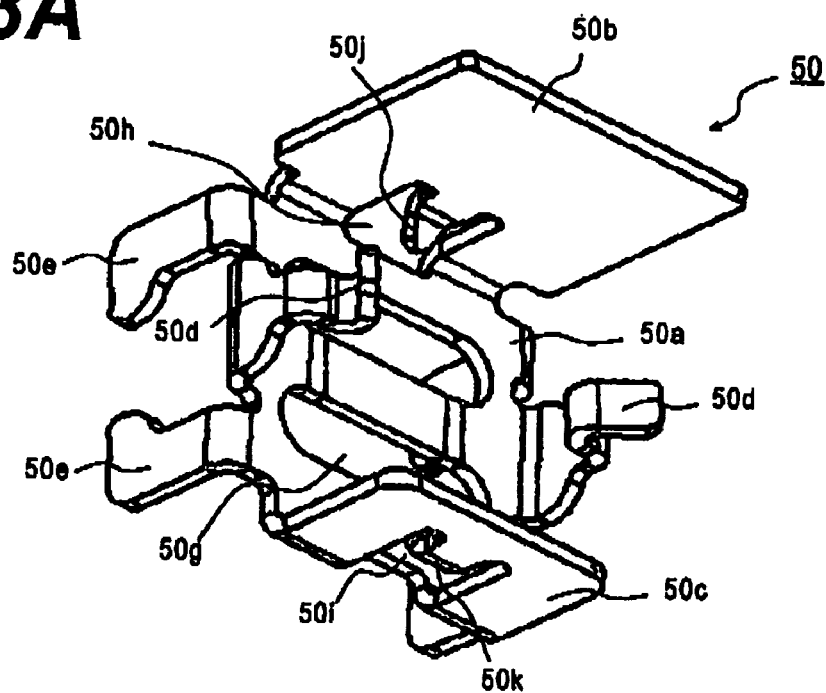
FIG. 3A is a perspective view from the top direction of the heat-radiating fin of the present invention.
Figure 3B:
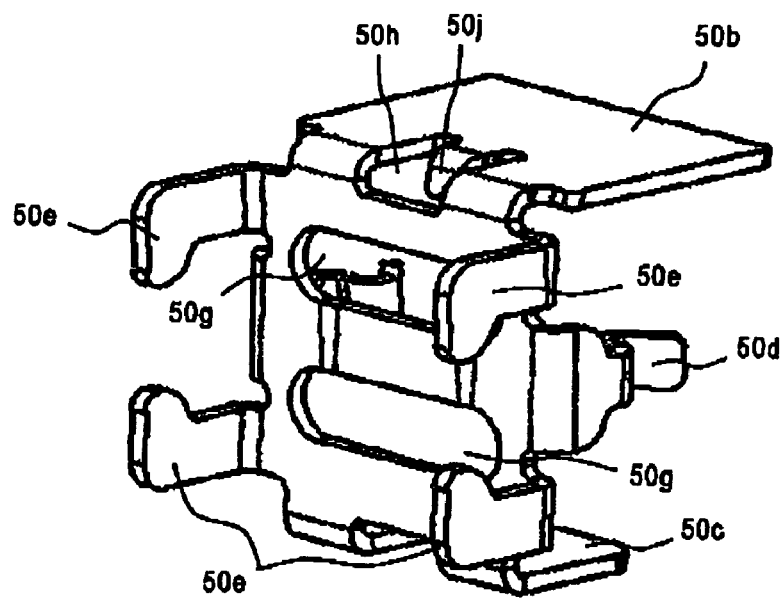
FIG. 3B illustrates the heat-radiating fin viewing from the different direction to that of FIG. 3B.

Next, the arrangement of fin 50 will be described. FIG. 3A and FIG. 3B are perspective view showing the radiating fin 50. FIG. 3A is a view from the front side, while FIG. 3B is a view from the rear side. The radiating fin 50 includes a base portion 50a, two slab platforms 50b and 50c, a set of latch 50d, and four legs 50e.

The base portion 50a is a rectangular plate with a pair of slots 50g in the center thereof, through which the arrayed-lead pins, 16a and 16b, pass.

Two slab portions, 50b and 50c, are formed to bend from two side opposite to each other of the base portion 50a. The first slab 50b is wider than the second slab 50c. Both slabs 50b and 50c include openings, 50h and 50i, in the root thereof, i.e. respective corners to the base portion 50a.

Fingers, 50j and 50k, protrude from the slabs, 50b and 50c, within respective openings, 50h and 50i, and bend to the inward side in the tips of the fingers. These fingers, 50j and 50k, mate with grooves 11c provided in the outer side surface of the stem 11, thus positioning the radiating fin 50 relative to the stem 11.

From another pair of sides of the base portion 50a, a pair of sides not continuing to the slabs 50b and 50c, a pair of latches 50d is protruded to the same direction to which the slabs, 50b and 50c, are extended. The latch 50d, at the tip thereof, is bent in inward and in arcuate. The latches 50d may fit with the flange 12f of cap 12, which is welded to the stem 11, thereby fixing the radiating fin 50 to the stem 11. The slabs, 50b and 50c, and the base portion 50a form a space into which the stem 11 of the OSA 2 is received. Further, the fingers, 50j and 50k, and the latches 50d position and fix the radiating fin 50 to the stem 11.

Four legs 50e are extended from sides, where the latches 50d extend therefrom, to a direction opposite to the direction where the latch 50d being projected thereto. These legs 50e may mechanically support the OSA 2, when the OSA 2 is installed within the transceiver and connected their lead pins 16 to the substrate implemented in the transceiver, by connecting the legs 50e to the ground on the substrate. This arrangement may stabilize the ground potential in the OSA 2.

Figure 4A:
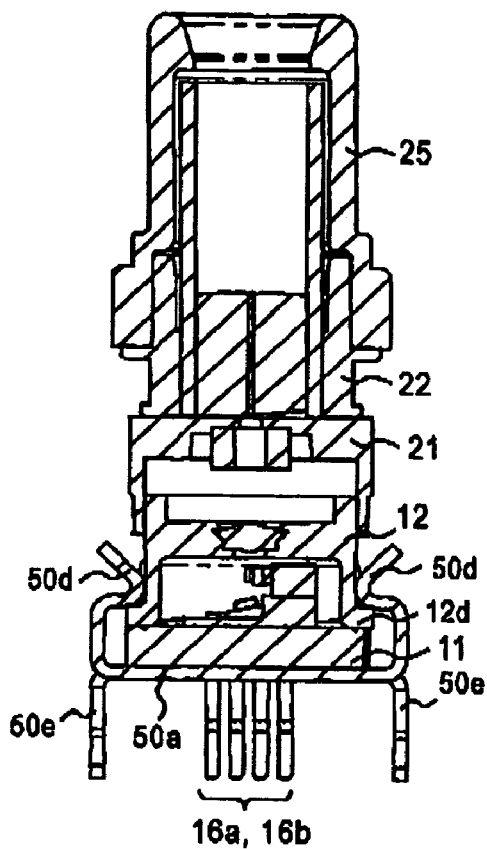
FIG. 4A is a cross section of the subassembly with the heat-radiating fin.
Figure 4B:
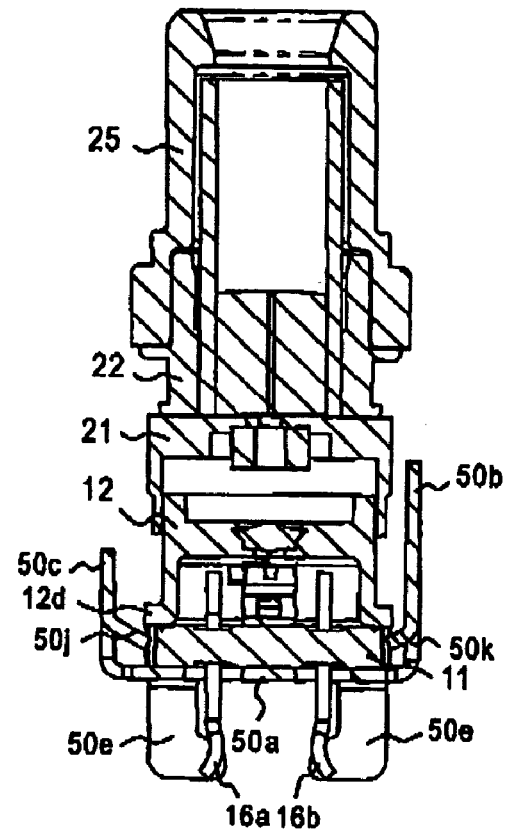
FIG. 4B is a cross section of the subassembly rotated by a right angle to that of FIG. 4A.
Figure 4C:
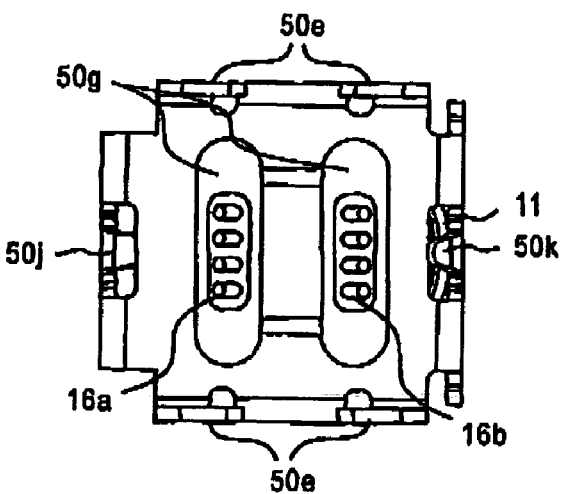
FIG. 4C is a bottom view of the subassembly with a heat-radiating fin.

From FIG. 4A to FIG. 4C are appearances when the radiating fin 50 is attached to the OSA 2. FIG. 4A is a view shown from one side, FIG. 4B is a view shown from another side, and FIG. 4C is a plan view of the assembly.

The base portion 50a of the radiating fin 50 is fixed to the stem 11 with solder. Within the space surrounded by slabs, 50b and 50c, and a pair of latches 50d is received by the stem 11 such that the latches 50d fit the flange 12f of the cap 12. The fingers, 50j and 50k, are mated with the corresponding groove 11c provided in the side of the stem 11, thereby positioning the radiating fin 50 relative to the stem 11, thus the arrayed-lead pins, 16b and 16c, can exactly pass through the corresponding slots 50g of the radiating fin 50.

According to the present invention, the radiating fin 50, which is made of thermally conductive material such as copper, is fixed in the base portions 50a thereof to the surface of the stem 11, and the slab platforms, 50b and 50c, continued to the base portion 50a is opened for the material having a good heat dissipating characteristic. On the other hand, the light-transmitting device 10 that generates large heat is mounted on the stem 11. Accordingly, the heat generated by the light-transmitting device 10 is effectively dissipated to the outside of the OSA 2, even when the stem 11 is made of metal having less thermal conductivity such as iron coated with nickel or nickel laminated with gold, or Kovar™, because the radiating fin 50 is in directly contact with or fixed to the stem 11 mounting the light-transmitting device 10 thereon.

From a viewpoint of the heat dissipation, the slabs 50b and the 50c preferably has large area. However, the area thereof is restricted to take the inner space of the optical transceiver into which the OSA 2 is to be installed. Although the radiating fin 50 is preferably thick for the thermal conductivity, another subject is manufacturing the fin 50 may occur, for example, the thicker the material of the fin 50, the harder to bend and to cut it. The present embodiment adopts the thickness of 0.5 mm for the radiating fin 50, which can cope with the heat dissipating function and the manufacturing. The complex structure shown in FIG. 3A and FIG. 3B can be realized with no problem.

Moreover, the description above is primarily concerning to the transmitting optical assembly (TOSA). However, the arrangement of the OSA mentioned above and the heat-radiating fin may be applied to a receiving optical subassembly (ROSA) that includes, for example, a photodiode for a semiconductor optical device.

Second Embodiment

Figure 5A:
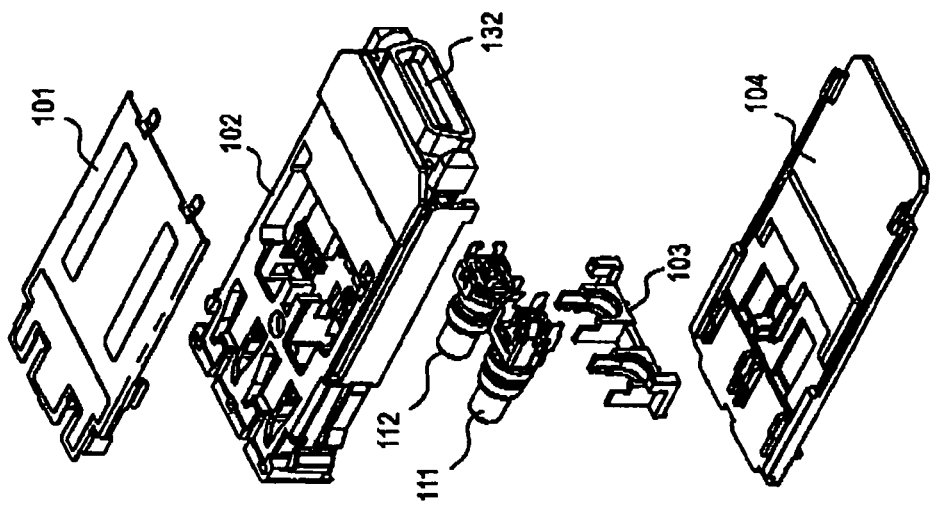
FIG. 5A is an exploded view of the optical transceiver installing the optical subassembly with the heat-radiating fin according to the present invention.
Figure 5B:
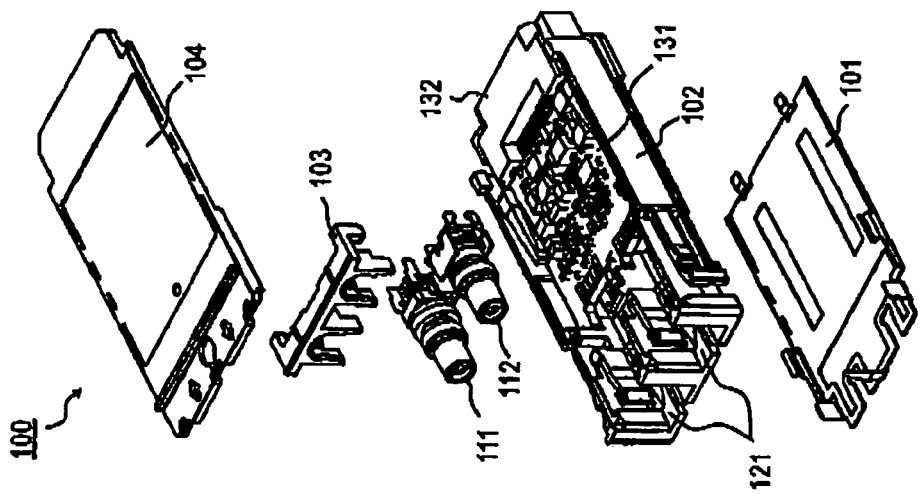
FIG. 5B is an exploded drawing of the optical transceiver viewed from the bottom side.

FIG. 5A and FIG. 5B are exploded view showing an optical transceiver that installs the OSA 2 according to the present invention. FIG. 5A is a view shown from the front-up side, while FIG. 5B is a view from a rear-bottom side. This transceiver has a configuration following the so-called GBIC (Giga-Bit Interface Converter) standard.

The optical transceiver 100 comprises a lower cover 101, a frame 102, two OSAs (the TOSA 111 and the ROSA 112), an OSA holder 103, and an upper cover 104. The frame 102 provides a receptacle 121 having two openings in the front side. The head portion of the TOSA 111 and the ROSA 112 are protruded within the opening of the receptacle 121, thus, within the receptacle, optically coupling between the ferrule included in the optical connector that is to be mated with the receptacle and the two OSAs are realized. The OSA holder 103 and the frame 102 define the positions of two OSAs, 111 and 112, in the frame by sandwiching them. The front wall of the OSA holder 103 serves as the partition of the receptacle 121.

A substrate 131 is implemented in the rear side of the TOSA 111 and the ROSA 112, on which an electronic circuit with a plurality of electronic components is mounted. This substrate 131 includes the electrical plug 132 in the rear end thereof. The electrical plug 132 mates with the other electrical connector provided on the motherboard, which is not shown in figures, onto which the transceiver is to be mounted. The electrical plug 132 transfers the signals and the electrical power to/from the circuit provided on the substrate 131.

The substrate 131 is physically and electrically connected with the TOSA 111 and ROSA 112 with lead pins 16b and 16c, and four legs 50e provided in the radiating pin 50. That is, in the present invention, the lead pins 16b and 16c are put into two groups, each including four lead pins and assembled in parallel to each other. The TOSA 111 and the ROSA 112 are installed such that these two groups sandwich the substrate 131. Moreover, four legs 50e are also put into two groups sandwiching the substrate 131 therebetween. To connect the legs 50e to the conduction pattern on the substrate 131 not only stabilizes the ground potential of subassemblies, but forms, in addition to the slabs, 50b and 50c, another heat dissipation path from the subassemblies to the conduction pattern on the substrate 131. This enhances the heat dissipating efficiency from the subassemblies.

Referring to FIG. 4B, the gap between two arrayed-lead pins, 16a and 16b, and that between legs 50e coincide to each other. Accordingly, the TOSA 111 and the ROSA 112 can be rigidly fixed to the substrate 131 by the surface mounting technique, in which no via holes passing the lead pin therethrough are provided on the substrate 131.

The slab 50b of the radiating fin 50 is thermally coupled with the upper cover 104 via a thermal sheet such as silicone rubber. Heat generating device within the OSA is the laser diode for the TOSA 111, while the pre-amplifier for the ROSA 112. These devices are mounted on the stem 11, and the radiating fin 50 is directly attached to the stem 11. Accordingly, heat generated by these devices effectively dissipates to the upper cover 104 via the radiating fin 50, which enhances the thermal stability of the transceiver.

Another slab 50c of the radiating fin 50, relatively narrower flange than the aforementioned slab 50b, thermally couples to the lower cover 101. As shown in FIG. 5B, a portion of the frame 102 is cut to expose a portion of the stem 11, so the radiating fin 50. Accordingly, another slab 50c may thermally couple with the lower cover 101 through another thermal sheet.

It will be apparent to those skilled in the art that various modifications and variations can be made to the present invention without departing from the spirit and scope of the invention. Thus, it is intended that the present invention covers the modifications and variations of this invention provided the come within the scope of the appended claims and their equivalents.

What is claimed is:

1. An optical subassembly optically coupled with an optical fiber, said optical subassembly comprising:
   a semiconductor optical device;
   a co-axial package including a disk-shaped stem, a plurality of lead pins and a cap, said stem having a first surface and a second surface opposite to said first surface, said lead pins passing thorough said stem and being grouped in two groups each group forming an array of lead pins extending in parallel to each other, said cap forming a cavity cooperating with said stem, said semiconductor optical device being installed on said first surface of said stem so as to be sealed within said cavity;
   a plurality of cylindrical members attached to said co-axial package, said cylindrical members optically aligning said semiconductor optical device with said optical fiber; and
   a heat-radiating fin including a body portion, a slab portion, and a plurality of leg portions, said body portion being attached to said second surface of said stem and having a slot for passing said lead pins therethrough, said slab portion extending and bending from said body portion to a first direction, said leg portions extending and bending to a second direction opposite to said first direction,
   wherein a gap between said leg portions is substantially equal to a gap between said arrays of said lead pins.

2. The optical subassembly according to claim 1, wherein said heat-radiating fin is made of copper.

3. The optical subassembly according to claim 1, wherein said heat-radiating fin includes a finger and said stem provides a groove in a side surface connecting said first surface to said second surface, said finger and said groove mating with each other to position and prevent rotation of said heat-radiating fin with respect to said stem.

4. The optical subassembly according to claim 1, wherein said heat-radiating fin includes a latch for latching said heat-radiating fin to said stem and said cap.

5. The optical subassembly according to claim 1, wherein said semiconductor optical device is a light-transmitting device.

6. The optical subassembly according to claim 1, wherein said semiconductor optical device is a light-receiving device.

7. An optical transceiver for receiving an optical connector with an optical fiber to transmit or to receive optical signal, said optical transceiver being installed on a motherboard, comprising:
   a lower cover;
   a frame with an optical receptacle for receiving said optical connector;
   an upper cover;

an optical subassembly according to claim 1; and a substrate electrically connected to said optical subassembly, said substrate having an electrical plug mating with an electrical connector provided on said motherboard, wherein said arrays of said lead pins and said leg portions sandwich said substrate.

8. The optical transceiver according to claim 7, wherein said slab portion is attached to said lower cover through a thermal sheet.

9. The optical transceiver according to claim 7, wherein said slab portion is attached to said upper cover through a thermal sheet.

10. The optical transceiver according to claim 7, wherein said heat-radiating fin includes a finger and said stem provides a groove in a side surface connecting said first surface to said second surface, said finger and said groove mating with each other to position and prevent rotation of said heat-radiating fin with respect to said stem.

11. The optical transceiver according to claim 7, wherein said heat-radiating fin includes a latch for latching said heat-radiating fin to said stem and said cap.

12. The optical transceiver according to claim 7, wherein said lead pins and said finger of said heat-radiating fin extend to a first direction, and said slab portion of said heat-radiating fin extends and bends to a second direction opposite to said first direction from said body portion.

13. An optical subassembly optically coupled with an optical fiber, said optical subassembly comprising:

a semiconductor optical device;

a co-axial package including a disk-shaped stem and a plurality of lead pins, said stem having a first surface, a second surface opposite to said first surface and a side surface connecting said first surface with said second surface, said lead pins passing through and extending from said stem, said semiconductor optical device being installed on said first surface of said stem, said side surface providing a groove; and a heat-radiating fin including a body portion, a slab portion, and a finger, said body portion being attached to said second surface of said stem, said slab portion extending and bending from said body portion to a first direction, said leg portions extending and bending to a second direction opposite to said first direction, wherein said finger mates with said groove to position and prevent rotation of said heat-radiating fin with respect to said stem.

14. The optical subassembly according to claim 13, wherein said plurality of lead pins is grouped in two groups, each group forming an array of lead pins extending in parallel to each other, and wherein said body portion of said heat radiating fin forms two slot in parallel to each other for passing said array of lead pins therethrough.

15. The optical subassembly according to claim 13, wherein said heat-radiating fin provides a latch for latching said heat-radiating fin with said stem.

16. The optical subassembly according to claim 13, wherein said lead pins and said finger of said heat-radiating fin extend to a first direction from said stem and said slab portion extends and bends to a second direction opposite to said first direction.

* * * * *